(12) United States Patent
Nomura et al.

(10) Patent No.: US 11,346,864 B2
(45) Date of Patent: May 31, 2022

(54) FLEXIBLE SENSOR AND MEASURING APPARATUS

(71) Applicant: HIOKI E.E. CORPORATION, Ueda (JP)

(72) Inventors: Atsushi Nomura, Ueda (JP); Yutaka Ashida, Ueda (JP); Shunsuke Suzuki, Ueda (JP)

(73) Assignee: HIOKI E.E. Corporation, Ueda (JP)

( * ) Notice: Subject to any disclaimer, the term of this patent is extended or adjusted under 35 U.S.C. 154(b) by 50 days.

(21) Appl. No.: 16/671,745

(22) Filed: Nov. 1, 2019

(65) Prior Publication Data

US 2020/0150150 A1    May 14, 2020

(30) Foreign Application Priority Data

Nov. 9, 2018 (JP) .............................. JP2018-211456

(51) Int. Cl.
*G01R 15/18* (2006.01)
*G01L 5/22* (2006.01)

(52) U.S. Cl.
CPC ............ *G01R 15/181* (2013.01); *G01L 5/228* (2013.01)

(58) Field of Classification Search
CPC .............................. G01R 15/181; G01L 5/228
See application file for complete search history.

(56) References Cited

U.S. PATENT DOCUMENTS

| | | | | |
|---|---|---|---|---|
| 3,434,052 A | * | 3/1969 | Fechant | G01R 15/181 324/127 |
| 3,555,420 A | * | 1/1971 | Schwartz | G01R 19/14 324/149 |
| 7,312,603 B2 | * | 12/2007 | Luo | G01R 1/22 324/127 |
| 2012/0126789 A1 | * | 5/2012 | Turpin | G01R 15/181 324/117 R |
| 2017/0059626 A1 | * | 3/2017 | Li | G01R 19/0092 |

FOREIGN PATENT DOCUMENTS

| | | | | |
|---|---|---|---|---|
| CN | 113447696 A | * | 9/2021 | ............ G01R 19/00 |
| DE | 102015115264 B3 | * | 8/2016 | ............ G01R 1/04 |
| JP | 2002181850 A | | 6/2002 | |
| JP | 2020076707 A | * | 5/2020 | ............ G01R 15/18 |

* cited by examiner

*Primary Examiner* — Paresh Patel
(74) *Attorney, Agent, or Firm* — Jordan IP Law, LLC

(57) ABSTRACT

A flexible sensor configured to detect a physical amount of a measurement target in a state surrounding the measurement target includes a sensor cable configured to detect the physical amount of the measurement target and a holding portion on which a base end portion of the sensor cable is mounted, the holding portion having a groove portion in which a distal end portion of the sensor cable is fitted from a side surface.

10 Claims, 8 Drawing Sheets

FLEXIBLE SENSOR AND MEASURING APPARATUS

CROSS-REFERENCE TO RELATED APPLICATION

The present application claims priority 35 U.S.C. § 119 to Japanese Patent Publication No. JP 2018-211456 (filed on Nov. 9, 2018), which is hereby incorporated by reference in its entirety.

TECHNICAL FIELD

The present invention relates to a flexible sensor adapted to detect a physical amount of a measurement target in a state surrounding the measurement target and a measuring apparatus. In this description, the flexible sensor refers to a sensor having flexibility.

BACKGROUND ART

JP2002-181850A discloses a current detector adapted to detect a current as a physical amount. This current detector includes a tube having flexibility and a conductive wire coiled around an outer peripheral surface of the tube and constitutes a Rogowski coil by deflecting the tube annularly.

SUMMARY OF INVENTION

However, in the current detector in JP2002-181850A, a worker needs to fit a distal end portion of the tube in a cylindrical holding portion by inserting the tube through a periphery of a conducting path in order to detect the current flowing through the conducting path. If the conducting path is small such as a terminal of an electronic component, the tube of the current detector needs to be thinned, and there is a concern that a work for fitting the distal end portion of the tube in the holding portion becomes difficult.

The present invention has an object to improve workability when the flexible sensor is mounted on the measurement target.

According to an aspect of the present invention, a flexible sensor configured to detect a physical amount of a measurement target in a state surrounding the measurement target includes a sensor cable configured to detect the physical amount of the measurement target and a holding portion on which a base end portion of the sensor cable is mounted, the holding portion having a groove portion in which a distal end portion of the sensor cable is fitted from a side surface.

According to the above-mentioned aspect, the flexible sensor can be mounted on the measurement target only by passing the sensor cable around the measurement target and by fitting the distal end portion of the sensor cable in the groove portion of the holding portion from the side surface. A worker can fit the sensor cable in the groove portion without using the both hands by pushing the sensor cable with the thumb while holding the holding portion with the palm, for example. Therefore, the workability when the flexible sensor is mounted on the measurement target can be improved.

DESCRIPTION OF EMBODIMENTS

Figure 1:
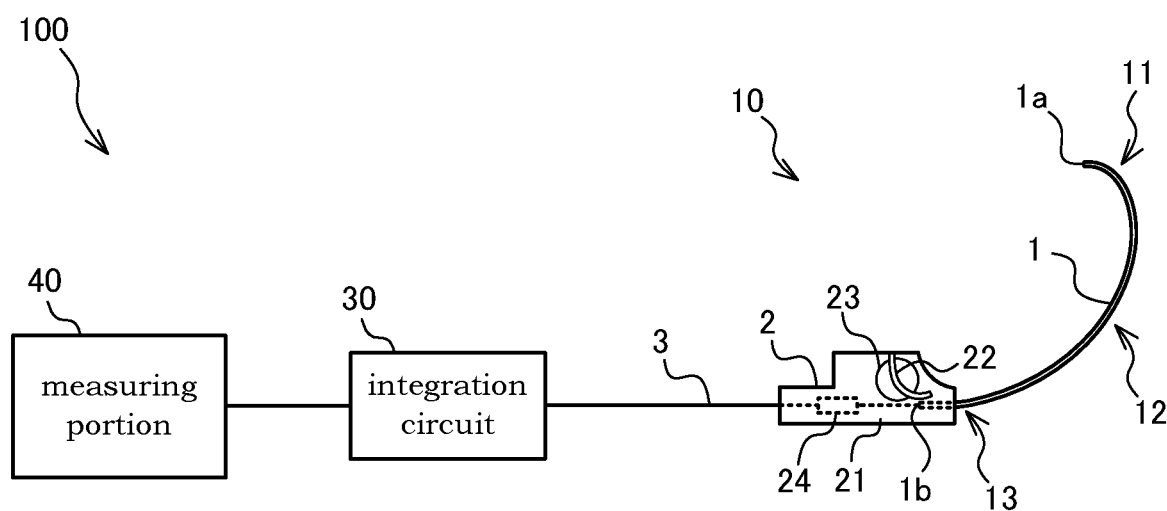
FIG. 1 is a diagram illustrating configuration of a measuring apparatus including a flexible sensor according to an embodiment of the present invention.

A current sensor 10 as a flexible sensor according to an embodiment of the present invention and a measuring apparatus 100 including the current sensor 10 will be described below by referring to the drawings.

First, configuration of the measuring apparatus 100 will be described by referring to FIG. 1. FIG. 1 is a view illustrating the configuration of the measuring apparatus 100.

The measuring apparatus 100 includes the current sensor 10 adapted to detect a current flowing through a measurement target, an integration circuit 30 that integrates a detection signal output from the current sensor 10, and a measuring portion 40 adapted to measure a physical amount of the measurement target on the basis of a signal output from the integration circuit 30.

Examples of the measurement targets include a powerline through which an AC current flows and a terminal of an electronic component mounted on a substrate. The physical amounts of the measurement target include a value of an AC current flowing through the measurement target, a value of an AC power, and a value of an AC magnetic field generated in a periphery of the measurement target.

The current sensor 10 detects the AC current flowing through the measurement target in a state surrounding the measurement target. The current sensor 10 includes a sensor cable 1 capable of detecting the AC current flowing through the measurement target and a holding portion 2 on which a base end portion 13 of the sensor cable 1 is mounted and having a groove portion 22 in which a distal end portion 11 of the sensor cable 1 is fitted from a side surface. The configuration of the current sensor 10 will be described in detail later by referring to FIGS. 2 to 4.

The integration circuit 30 converts a detection signal indicating a voltage induced in a lead wire of the sensor cable 1 to a signal in proportion to an amplitude of the current flowing through the measurement target. The integration circuit 30 outputs the converted signal as a detection signal to the measuring portion 40.

The measuring portion 40 measures the physical amount of the measurement target on the basis of the detection signal from the integration circuit 30. When the measuring portion 40 receives the detection signal from the integration circuit 30, for example, it measures the AC current flowing through the measurement target on the basis of the detection signal.

The measuring portion 40 may measure strength of the AC current or the magnetic field on the basis of the received detection signal as another physical amount. The measuring portion 40 displays a waveform of the measured physical amount on a screen. The measuring portion 40 is constituted by an oscilloscope, a wattmeter or an ammeter, for example.

Figure 2:
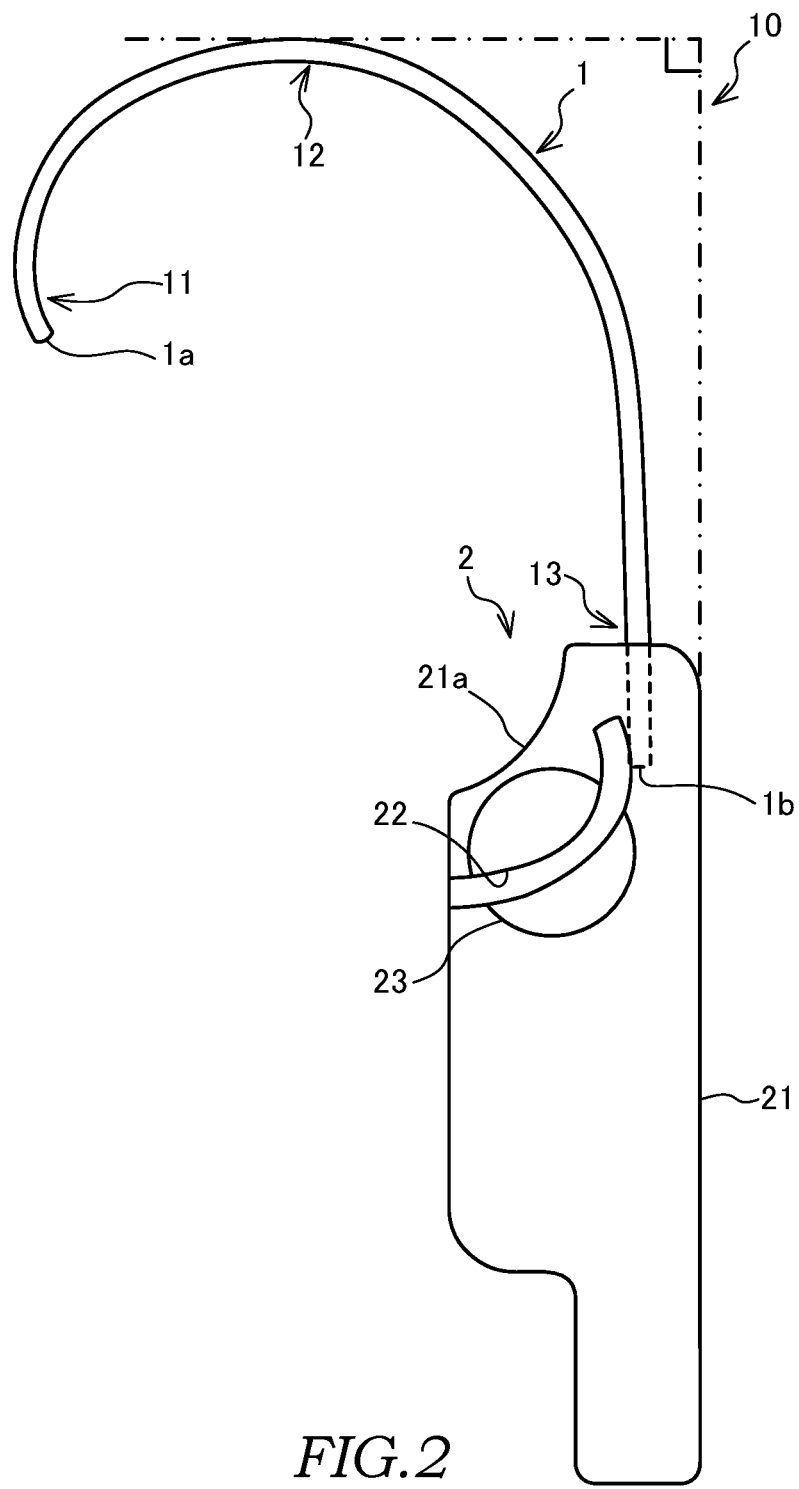
FIG. 2 is a front view illustrating a state where a sensor cable of the flexible sensor is open.
Figure 3:
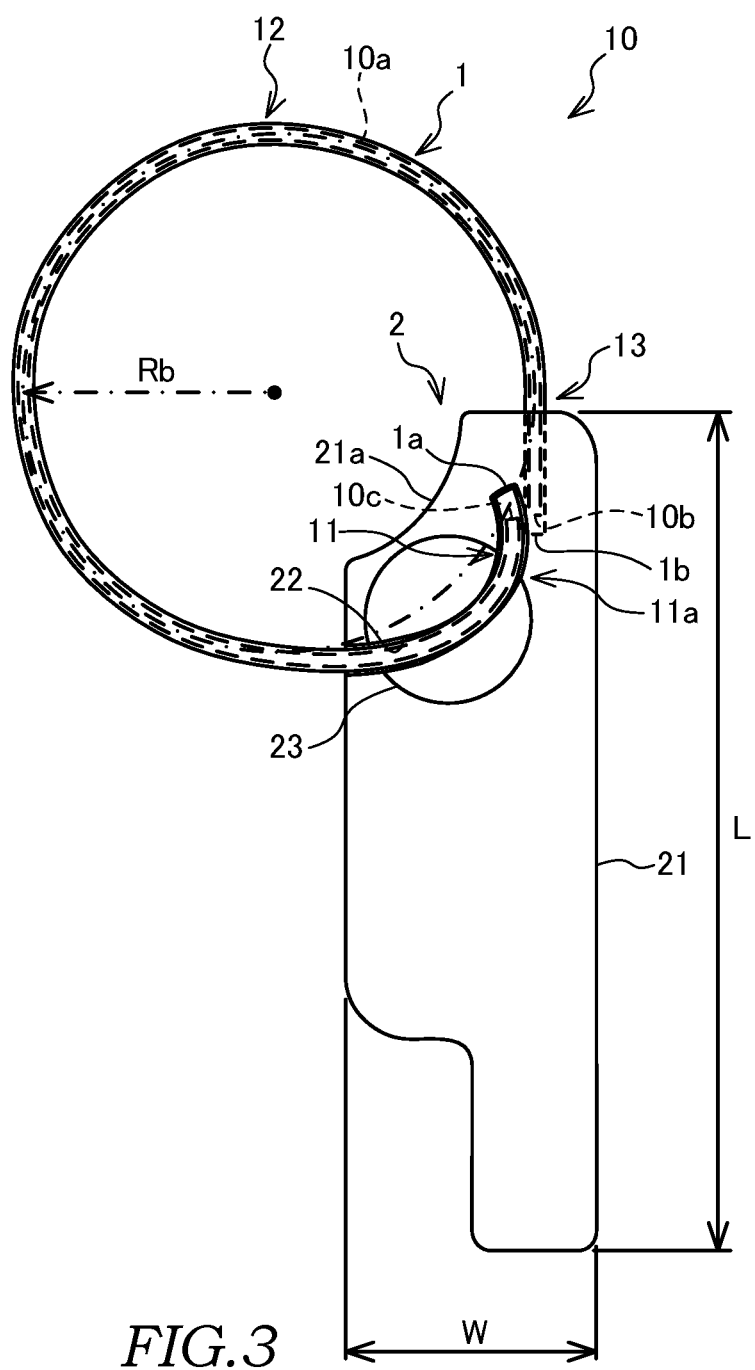
FIG. 3 is a front view illustrating a state where the sensor cable of the flexible sensor is closed.
Figure 4:
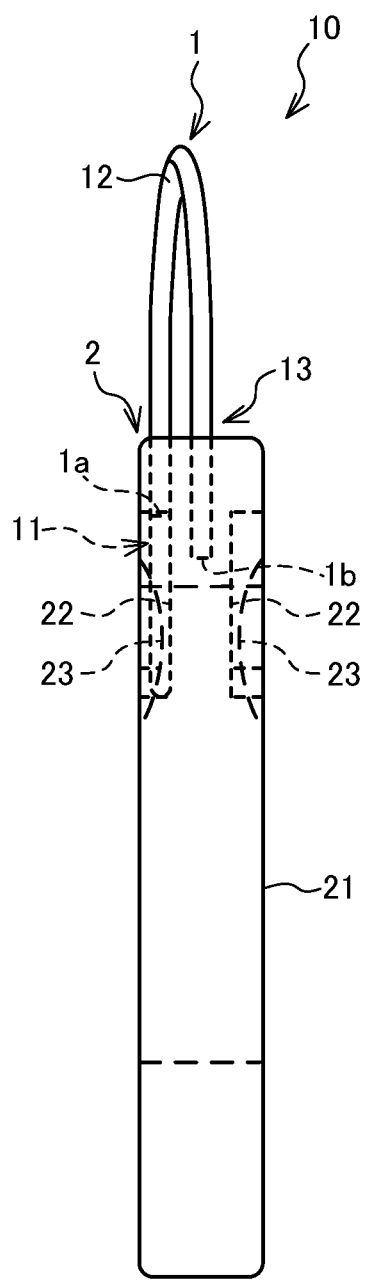
FIG. 4 is a right side view in FIG. 3.

Subsequently, configuration of the current sensor 10 will be described by referring to FIGS. 2 to 4. FIG. 2 is a front view of the current sensor 10 illustrating a state where the sensor cable 1 is open. FIG. 3 is a front view of the current sensor 10 illustrating a state where the sensor cable 1 is closed. FIG. 4 is a right side view in FIG. 3.

As illustrated in FIG. 2, the sensor cable 1 is molded into a curved shape in advance so that it surrounds the measurement target easily. The sensor cable 1 has flexibility and is capable of deflection when it surrounds the measurement target. The sensor cable 1 has elasticity and recovers an original shape or a substantially original shape when an external force is removed.

As illustrated in FIG. 3, the sensor cable 1 has a Rogowski coil 10a formed along a longitudinal direction. That is, the sensor cable 1 is a Rogowski-coil type current sensor having flexibility.

The entire sensor cable 1 is covered with a resin material such as a fluorine resin. As a result, when the measurement target is to be surrounded, such a situation can be prevented that the sensor cable 1 is not caught by the measurement target or another adjacent member adjacent to that, and the sensor cable 1 is damaged.

A portion with a curvature larger than the curvature of the base end portion 13 having a base end 1b of the sensor cable 1 is formed at the distal end portion 11 of the sensor cable 1. The distal end portion 11 is a portion having a specific length n including a distal end 1a of the sensor cable 1, and the curvature of the distal end 1a may be made the largest or the curvature of another portion may be made larger than the curvature of the base end portion 13 without giving the curvature to the distal end 1a.

The Rogowski coil 10a is formed by coiling a lead sire spirally around a hollow flexible member with insulation. The flexible member is constituted by a synthetic resin such as vinyl chloride or polyethylene. The coiled lead wire is folded in the vicinity of the distal end 1a of the sensor cable 1, passes through an inside of the hollow flexible member and extends to the base end 1b of the sensor cable 1.

The Rogowski coil 10a has both end portions 10b and 10c close to a circumferential direction so as to be annular in a state where the distal end portion 11 is fitted into the groove portion 22 (state illustrated in FIG. 3). As a result, since an incomplete region of the Rogowski coil 10a can be made smaller, an influence of a noise caused by a magnetic flux generated from another conductor to which the sensor cable 1 is close can be made smaller.

At this time, since the resin material such as a fluorine resin covers the Rogowski coil 10a, the Rogowski coil 10a can be provided only up to a position retreated from the distal end 1a and the base end 1b by approximately 1 to 2 mm. Thus, the base end portion 13 and the distal end portion 11 are overlapped with each other in a longitudinal direction (circumferential direction) in the state where the both end portions 10b and 10c of the Rogowski coil 10a are close to each other.

The distal end portion 11 of the sensor cable 1 has an identification portion 11a by which a worker can identify that it is fitted into the groove portion 22 at a predetermined position. That is, a portion in the sensor cable 1 fitted into the groove portion 22 can be identified from the other portions. More specifically, it is made visually identifiable by the worker by giving colors or patterns different between the identification portion 11a and the other portions, for example.

As a result, since the distal end portion 11 of the sensor cable 1 can be fitted into the groove portion 22 at the predetermined position, a change in a size of the incomplete region of the Rogowski coil 10a at every measurement of the current in the measurement target can be prevented.

As illustrated in FIG. 2, in the sensor cable 1, the distal end portion 11 is bent inward in advance in accordance with a shape of the groove portion 22 so that the distal end 1a having passed behind the measurement target comes closer to the front than a front surface of the measurement target. Thus, the sensor cable 1 is formed with a curved shape so that a tangent line of an intermediate portion 12 between the distal end portion 11 and the base end portion 13 of the sensor cable 1 is orthogonal to a straight line extending in an extending direction of a fixing portion 21.

Moreover, the base end portion 13 of the sensor cable 1 is formed linearly so that, when the holding portion 2 is pushed out with the finger of the worker toward the measurement target, the force can be transmitted to the intermediate portion 12 of the sensor cable 1 easily. Furthermore, the intermediate portion 12 of the sensor cable 1 is formed with a curvature larger than the curvature of the base end portion 13 of the sensor cable 1 and smaller than the curvature of the distal end portion 11 so that the sensor cable 1 is not caught easily by an edge of the adjacent member of the measurement target.

As described above, in the sensor cable 1, the closer it gets from the base end portion 13 to the distal end portion 11, the larger the curvature of the sensor cable 1 becomes in steps or continuously. As a result, the force of the worker can be transmitted from the holding portion 2 to the sensor cable 1 more easily, and the sensor cable 1 is not easily caught by the measurement target or its adjacent member.

Hereinafter, as illustrated in FIG. 3, a radius of curvature Rb of the sensor cable 1 in a state where the distal end portion 11 of the sensor cable 1 is held in the groove portion 22 of the holding portion 2 is referred to as a reference radius, and an inverse number (1/Rb) of this reference radius is referred to as a reference curvature.

Here, the reference radius Rb has a size of approximately 10 mm. The current sensor 10 is for measuring a current flowing through a relatively small measurement target.

The holding portion 2 is an operation portion operated by a hand or a finger of the worker. The holding portion 2 includes the fixing portion 21 which fixes a part of the sensor cable 1, the groove portion 22 in which the distal end portion 11 of the sensor cable 1 is fitted by the worker from the side surface when the measurement target is surrounded, a recess portion 23 including at least a part of the groove portion 22, and a matching circuit 24 (see FIG. 1) which matches an impedance on the sensor cable 1 side with an impedance on the measuring portion 40 side.

The groove portion 22 and the recess portion 23 are formed in the fixing portion 21. The matching circuit 24 is provided inside the fixing portion 21. The fixing portion 21 is formed having a size of a length L of approximately 30 mm and a width W of approximately 10 mm so that the worker can easily hold it, for example. The fixing portion 21 has a projecting portion 21a projecting toward the measurement target surrounded by the sensor cable 1.

The projecting portion 21a is formed having an arc shape substantially concentrically with an arc of the reference radius Rb. The projecting portion 21a limits a size of the measurement target to be surrounded by the sensor cable 1 when the sensor cable 1 is in a closed state. As a result, the measurement target having a thickness through which a current larger than a range measurable by the current sensor 10 flows can be prevented from being surrounded by the sensor cable 1. Moreover, since the projecting portion 21a is provided, positioning of the measurement target can be limited so that it cannot be placed close to the incomplete region of the Rogowski coil 10a.

The groove portion 22 is formed having the same shape as the shape of the distal end portion 11 of the sensor cable 1. Since the sensor cable 1 is not deformed when it is fitted into the groove portion 22, the shape (curvature) of the distal end portion 11 can be maintained. As a result, the resin material with flexibility constituting the sensor cable 1 can memorize an ideal shape.

As illustrated in FIG. 4, the groove portion 22 is formed in each of both front and rear surfaces of the holding portion 2. The distal end portion 11 of the sensor cable 1 can be fitted into either of the groove portions 22. As a result, the worker can perform the work while considering from which direction the sensor cable 1 is to be passed depending on the position or shape of the measurement target.

When the distal end portion 11 of the sensor cable 1 is inserted through the groove portion 22, the current sensor 10 is brought into a closed state (state illustrated in FIG. 3). On the other hand, when the distal end portion 11 of the sensor cable 1 is removed from the groove portion 22, the current sensor 10 is brought into an open state (state illustrated in FIG. 2). Moreover, in the fixing portion 21, the base end 1b of the sensor cable 1 and a cable 3 of the integration circuit 30 are electrically connected to each other (see FIG. 1).

As illustrated in FIGS. 2 and 3, the recess portion 23 is formed circularly around the groove portion 22. The recess portion 23 is formed shallower than the groove portion 22 and having a larger area. The recess portion 23 is formed so that the finger can enter therein when the worker fits the distal end portion 11 of the sensor cable 1 into the groove portion 22. Since the worker can firmly push the sensor cable 1 into the groove portion 22 due to the formation of the recess portion 23, the distal end portion 11 can be fitted into the groove portion 22 easily.

As illustrated in FIG. 4, the recess portion 23 is also formed on each of the both front and rear surfaces of the holding portion 2. The shape of the recess portion 23 is not limited to a circle but may be other shapes. The recess portion 23 may be formed having an oval shape longer in a length direction of the fixing portion 21 in compliance with the shape of the thumb of the hand of the worker holding the holding portion 2 so that the thumb of the worker can enter easily, for example.

Figure 5:
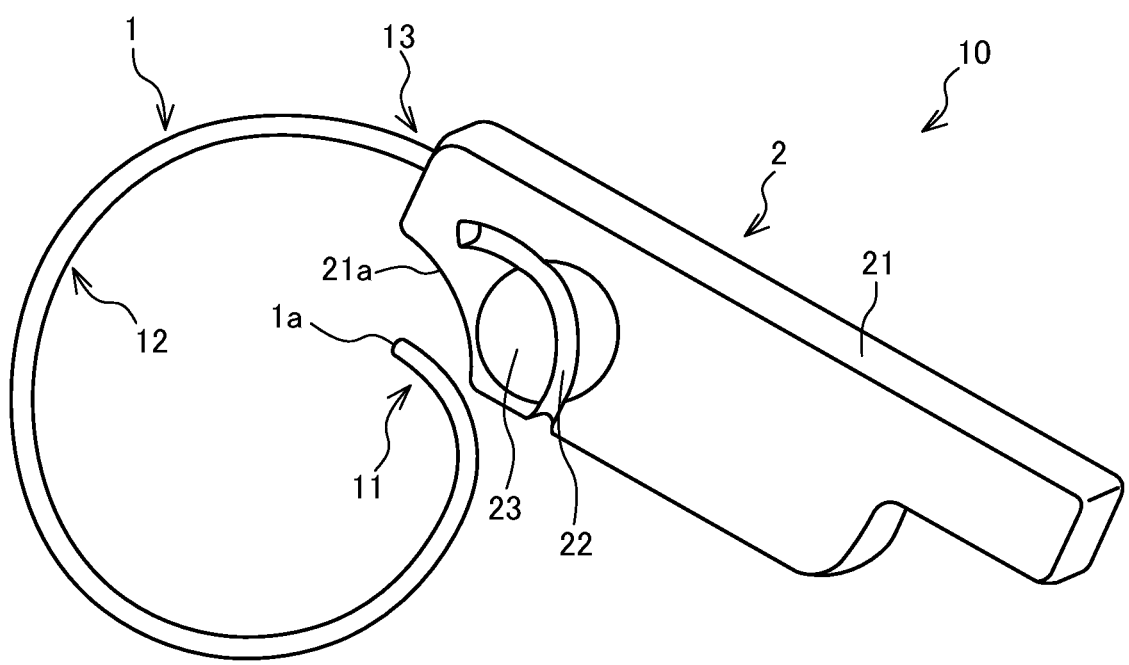
FIG. 5 is a perspective view illustrating the state where the sensor cable of the flexible sensor is open.
Figure 6:
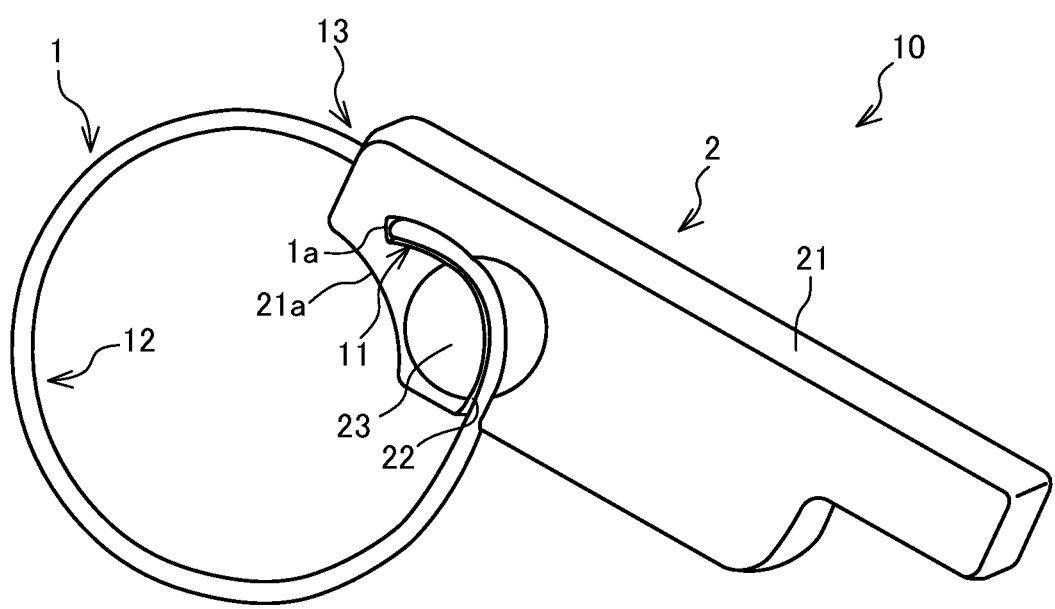
FIG. 6 is a perspective view illustrating the state where the sensor cable of the flexible sensor is closed.

Subsequently, a use form of the current sensor 10 will be described by referring to FIGS. 5 and 6. FIG. 5 is a perspective view illustrating the shape of the sensor cable 1 in the state where the current sensor 10 is in the open state. FIG. 6 is a perspective view illustrating the shape of the sensor cable 1 in the state where the current sensor 10 is closed.

As illustrated in FIG. 5, in the state where the distal end portion 11 of the sensor cable 1 is not fitted into the groove portion 22, the current sensor 10 is in the open state. When the worker pushes the distal end portion 11 into the groove portion 22 by the finger from this state in accordance with the position of the groove portion 22, the state illustrated in FIG. 6 is brought about.

As illustrated in FIG. 6, when the distal end portion 11 of the sensor cable 1 is fitted into the groove portion 22 by the worker, the distal end portion 11 of the sensor cable 1 is held in the groove portion 22. As a result, the current sensor 10 is brought into the closed state, and the measurement target is surrounded by the sensor cable 1.

As described above, the sensor cable 1 is can be mounted on the measurement target only by passing the sensor cable 1 around the measurement target and by fitting the distal end portion 11 of the sensor cable 1 into the groove portion 22 of the holding portion 2 from the side. The worker can fit the sensor cable 1 into the groove portion 22 by pushing the sensor cable 1 with the thumb while holding the holding portion 2 with the palm, for example, without using both hands. Therefore, the workability when the sensor cable 1 is mounted on the measurement target can be improved.

Particularly, the current sensor 10 is for measuring the current flowing through a relatively small measurement target with the reference radius Rb of the sensor cable 1 at approximately 10 mm. According to the current sensor 10, by configuring it as above, the workability can be improved also when the sensor cable 1 is mounted on a small measurement target.

When the distal end portion 11 of the sensor cable 1 is removed from the groove portion 22 of the holding portion 2, the sensor cable 1 having flexibility returns to an original shape as illustrated in FIG. 2, but since the distal end portion 11 is not deformed when it is fitted into the groove portion 22, the shape is maintained as it is.

Figure 7A:
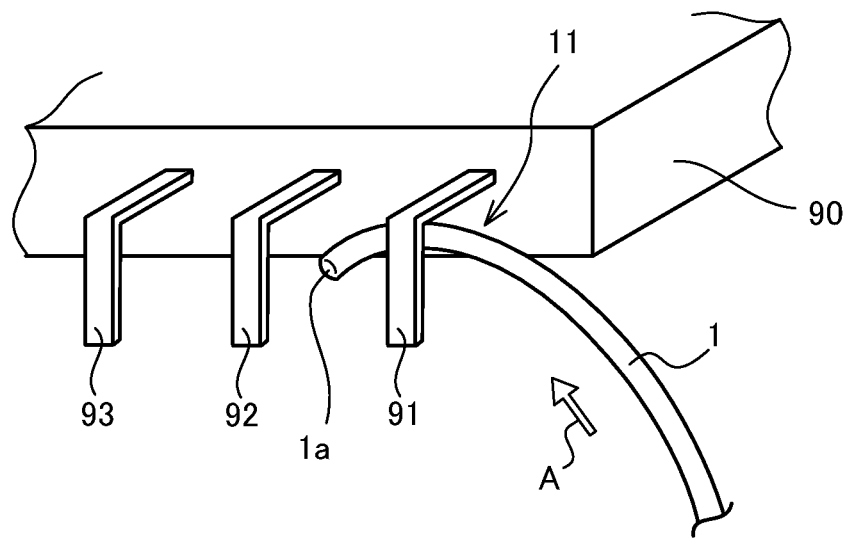
FIG. 7A is a view illustrating a procedure of surrounding a terminal of an electronic component by the sensor cable.
Figure 7B:
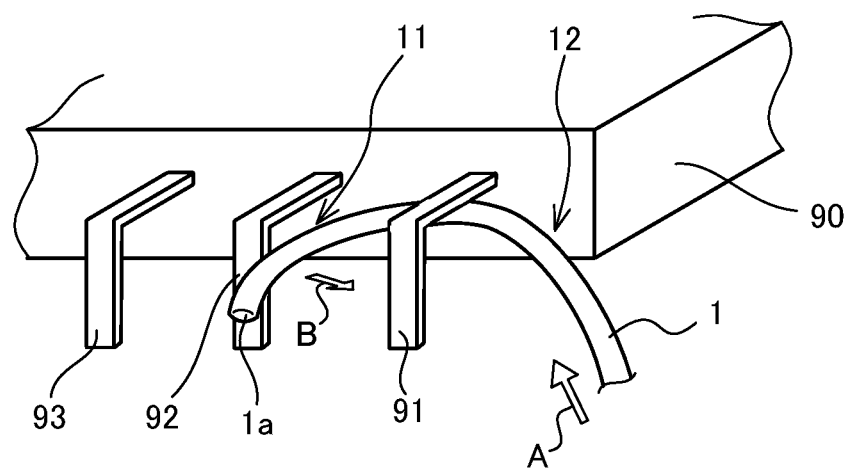
FIG. 7B is a view illustrating the procedure of surrounding a terminal of an electronic component by the sensor cable.
Figure 7C:
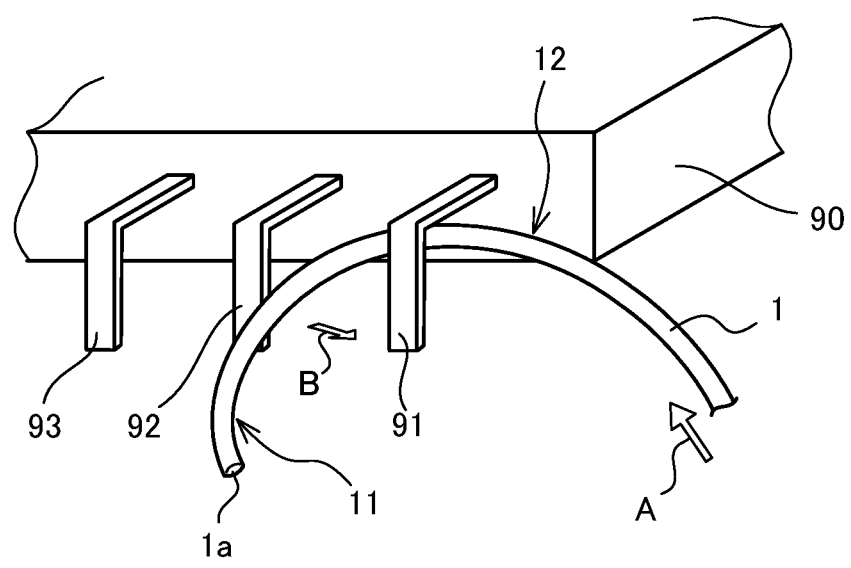
FIG. 7C is a view illustrating the procedure of surrounding a terminal of an electronic component by the sensor cable.

Subsequently, a procedure in which a terminal (foot) of an electronic component mounted on a substrate is used as a measurement target, and the terminal of the electronic component is surrounded by the sensor cable 1 will be described by referring to FIGS. 7A to 7C. FIGS. 7A to 7C are views for explaining a procedure for feeding the distal end 1a of the sensor cable 1 to the front from behind a terminal 91 of an electronic component 90.

In an example illustrated in FIGS. 7A to 7C, an electronic component such as an IC (Integrated Circuit) or a DC/DC converter is used as the electronic component 90. An interval between the terminal 91 and a terminal 92 of the electronic component 90 is approximately several mm (millimeters). A thickness (diameter) of the sensor cable 1 is formed to be 1 mm or more and 2 mm or less so that it can enter the interval between the terminal 91 and the terminal 92.

As illustrated in FIG. 7A, the worker inserts the distal end 1a of the sensor cable 1 between the electronic component 90 and the terminal 91 by moving the holding portion 2 toward the terminal 91 in the state holding the holding portion 2 by the fingers.

At this time, since the distal end portion 11 of the sensor cable 1 is formed with a curvature not smaller than the reference curvature (1/Rb) in the state where the current sensor 10 is closed, when the distal end portion 11 of the sensor cable 1 is inserted behind the terminal 91, the distal end 1a of the sensor cable 1 can be moved so as to cover back of the terminal 91. Thus, such a situation that the sensor cable 1 is caught by an edge of the terminal 91 and the sensor cable 1 is damaged can be suppressed.

Moreover, since the distal end portion 11 of the sensor cable 1 is formed with a curvature not smaller than the reference curvature (1/Rb), the distal end 1a of the sensor cable 1 having passed the back of the terminal 91 can be directed toward the front surface from the rear surface of the terminal 91 easily with respect an insertion direction A of the sensor cable 1. As a result, the worker can cause the distal end 1a of the sensor cable 1 to abut to the side surface of the terminal 92 easily in order to bring the distal end 1a of the sensor cable 1 to a front of the terminal 91. Thus, the distal end 1a of the sensor cable 1 can be inserted through the small interval between the terminal 92 and the terminal 91 from the rear surface of the terminal 91 toward the front surface.

A radius of curvature of the distal end portion 11 of the sensor cable 1 is preferably made smaller than the interval between the terminal 91 and the terminal 92 of the electronic component 90. Particularly, by forming the radius of curvature of the distal end portion at 2 mm or more and 4 mm or less, such a situation that the sensor cable 1 is caught by the edge of the terminal provided on the electronic component and the sensor cable 1 is damaged can be suppressed.

Subsequently, as illustrated in FIG. 7B, the worker further moves the holding portion 2 in the insertion direction A so that the intermediate portion 12 of the sensor cable 1 is pushed toward the electronic component 90 behind the terminal 91.

As a result, the intermediate portion 12 of the sensor cable 1 is pushed onto the electronic component 90, and the sensor cable 1 is directed toward an inner side B with the portion as a fulcrum and thus, the sensor cable 1 is not caught by each of the edges of the terminals 91 and 92 easily. As a result, the sensor cable 1 is not damaged easily.

Furthermore, as illustrated in FIG. 7C, the remaining sensor cable 1 is fed out toward the back of the terminal 91 by the worker's pushing the holding portion 2 in the insertion direction A. At this time, since the curvature of the intermediate portion 12 of the sensor cable 1 is smaller than the reference curvature (1/Rb) toward the holding portion 2, the distal end portion 11 of the sensor cable 1 can be brought closer to the groove portion 22 of the holding portion 2 while bending of the sensor cable 1 is suppressed.

After that, since the distal end portion 11 of the sensor cable 1 is fitted into the groove portion 22 by the worker, the measurement target is surrounded by the sensor cable 1. As described above, with regard to the current sensor 10, the terminal 91 can be surrounded by the sensor cable 1 easily by the worker.

According to the embodiment above, the following effects can be exerted.

The current sensor 10 detects the current flowing through the measurement target in the state surrounding the measurement target. The current sensor 10 includes the sensor cable 1 adapted to detect the current flowing through the measurement target and the holding portion 2 on which the base end portion 13 of the sensor cable 1 is mounted and having the groove portion 22 in which the distal end portion 11 of the sensor cable 1 is fitted from the side surface.

As a result, the sensor cable 1 is mounted on the measurement target only by passing the sensor cable 1 around the measurement target and by fitting the distal end portion 11 of the sensor cable 1 into the groove portion 22 of the holding portion 2 from the side. The worker can fit the sensor cable 1 into the groove portion 22 without using the both hands but only by pushing the sensor cable 1 with the thumb while holding the holding portion 2 with the palm, for example. Therefore, the workability when the sensor cable 1 is mounted on the measurement target can be improved.

Particularly, the current sensor 10 is for measuring the current flowing through a relatively small measurement target with the reference radius Rb of the sensor cable 1 at approximately 10 mm. According to the current sensor 10 configured as above, the workability can be improved also when the sensor cable 1 is mounted on a small measurement target.

Moreover, the sensor cable 1 has the Rogowski coil 10a formed along the longitudinal direction, and the Rogowski coil 10a has the both end portions 10b and 10c closer to each other in the circumferential direction so as to be annular in the state where the distal end portion 11 is fitted into the groove portion 22. The sensor cable 1 has the base end portion 13 and the distal end portion 11 overlapped in the longitudinal direction (circumferential direction) in the state where the both end portions 10b and 10c of the Rogowski coil 10a close to each other.

As a result, since the incomplete region of the Rogowski coil 10a can be made smaller, an influence of a noise caused by a magnetic flux generated from another conductor to which the sensor cable 1 is close can be made smaller.

Moreover, a portion with a curvature larger than the curvature of the base end portion 13 of the sensor cable 1 is formed on the distal end portion 11 having the distal end 1a of the sensor cable 1.

Since the curvature of the distal end portion 11 of the sensor cable 1 is larger than the curvature of the base end portion 13, the distal end 1a of the sensor cable 1 inserted behind the measurement target can be directed to the front surface from the rear surface of the measurement target easily. As a result, the worker can cause the distal end 1a of the sensor cable 1 to be brought to the front of the measurement target easily by operating the holding portion 2 even if the worker does not insert the hand or a tweezer behind the measurement target.

Thus, to withdraw the distal end 1a of the sensor cable 1 to the front of the measurement target so as to surround the measurement target by the entire sensor cable 1 is made easy. Therefore, even in a situation that the worker can hardly or cannot insert the hand behind the measurement target, the measurement target can be surrounded easily.

Moreover, the groove portion 22 is formed having the same shape as the shape of the distal end portion 11 of the sensor cable 1.

Thus, the sensor cable 1 is not deformed when it is fitted into the groove portion 22. As a result, there is no need to deform the distal end portion 11 linearly each time the sensor cable 1 is mounted on the measurement target as in the configuration in which the distal end portion 11 of the sensor cable 1 is inserted into an insertion hole. Thus, the shape (curvature) of the distal end portion 11 can be maintained even after the sensor cable 1 is fitted into the groove portion 22. Therefore, the resin material with flexibility and configuring the sensor cable 1 can memorize the ideal shape for facilitating surrounding of the measurement target.

The holding portion 2 has the recess portion 23 including at least a part of the groove portion 22. The recess portion 23 is formed shallower than the groove portion 22 and having a larger area.

As a result, when the worker fits the distal end portion 11 of the sensor cable 1 into the groove portion 22, the finger enters into the recess portion 23. Thus, since the worker can firmly push the sensor cable 1 into the groove portion 22, the distal end portion 11 can be fitted into the groove portion 22 easily.

Moreover, the groove portion 22 is formed each on the both front and rear surfaces of the holding portion 2, and the distal end portion 11 of the sensor cable 1 can be fitted into either of the groove portions 22.

As a result, the worker can perform the work while considering in which direction the sensor cable 1 is to be passed depending on the position or shape of the measurement target.

Moreover, the distal end portion 11 of the sensor cable 1 has the identification portion 11a by which the worker can identify that it is fitted into the groove portion 22 at a predetermined position.

As a result, since the distal end portion 11 of the sensor cable 1 can be fitted into the groove portion 22 at the predetermined position, a change in the size of the incomplete region of the Rogowski coil 10*a* at every measurement of the current in the measurement target can be prevented.

Embodiments of this invention were described above, but the above embodiments are merely examples of applications of this invention, and the technical scope of this invention is not limited to the specific constitutions of the above embodiments.

The curvature of each portion of the distal end portion 11, the intermediate portion 12, and the base end portion 13 of the sensor cable 1 may be constant or may be continuously made smaller. The intermediate portion 12 of the sensor cable 1 may be omitted. Alternatively, it may be so configured that each portion of the sensor cable 1 is formed with a constant curvature, and its length is set to one fourth of a circumference for each portion.

Moreover, even if there is a narrow space between the electronic component 90 and the substrate in a state where the electronic component having a plurality of terminals on a bottom surface is mounted on the substrate, the current sensor 10 in the aforementioned embodiment can be used. Even in this case, the terminal of the electronic component can be easily surrounded by the sensor cable 1.

Moreover, a material not only which is elastically deformed but also plastically deformed may be used for the sensor cable 1. Furthermore, the thickness (diameter) of the sensor cable 1 may be formed at less than 1 mm if it is physical possible.

This application claims priority based on the Japanese Patent Application No. 2018-211456 filed with the Japan Patent Office on Nov. 9, 2018, the entire contents of which are incorporated into this specification.

What is claimed is:

1. A flexible sensor configured to detect a physical amount of a measurement target in a state surrounding the measurement target, comprising:
   a sensor cable configured to detect the physical amount of the measurement target; and
   a holding portion on which a base end portion of the sensor cable is mounted, the holding portion having a groove portion in which a distal end portion of the sensor cable is fitted from a side surface, wherein the groove portion extends along the side surface of the holding portion, the groove portion being exposed along a length direction of the groove portion,
   wherein the sensor cable has a Rogowski coil formed along a longitudinal direction, and
   further wherein the Rogowski coil has both end portions close to each other annularly in a state where the distal end portion is fitted into the groove portion.

2. The flexible sensor according to claim 1, wherein the sensor cable has the base end portion and the distal end portion overlapped in a circumferential direction in a state where the both end portions of the Rogowski coil are close to each other in the circumferential direction.

3. The flexible sensor according to claim 1, wherein in the sensor cable, a portion with a curvature larger than the curvature of the base end portion is formed on the distal end portion.

4. The flexible sensor according to claim 1, wherein the groove portion is formed having a same shape as the shape of the distal end portion of the sensor cable.

5. The flexible sensor according to claim 1, wherein the holding portion has a recess portion including at least a part of the groove portion; and
   the recess portion is formed shallower than the groove portion and having a larger area than the groove portion.

6. The flexible sensor according to claim 1, wherein the groove portion includes a first groove portion formed on a front surface of the holding portion, and a second groove portion formed on a rear surface of the holding portion; and
   the distal end portion of the sensor cable is fitted into the first groove portion or the second groove portion.

7. The flexible sensor according to claim 1, wherein the distal end portion of the sensor cable has an identification portion by which a worker can identify that the distal end portion is fitted into the groove portion at a predetermined position.

8. A measuring apparatus comprising:
   the flexible sensor according to claim 1; and
   a measuring portion configured to measure a physical amount of the measurement target on a basis of a detection signal detected by the flexible sensor.

9. The flexible sensor according to claim 1, wherein the groove portion is exposed from a front surface of the holding portion or a rear surface of the holding portion.

10. The flexible sensor according to claim 9, wherein an entrance of the groove portion is in the side surface.

* * * * *